US012666905B2

(12) United States Patent
Sharrock

(10) Patent No.: US 12,666,905 B2
(45) Date of Patent: *Jun. 23, 2026

(54) PROCESS APPARATUS WITH ON-THE-FLY SUBSTRATE CENTERING

(71) Applicant: BROOKS AUTOMATION US, LLC, Chelmsford, MA (US)

(72) Inventor: Leigh F. Sharrock, Londonderry, NH (US)

(73) Assignee: BROOKS AUTOMATION US, LLC, Chelmsford, MA (US)

( * ) Notice: Subject to any disclaimer, the term of this patent is extended or adjusted under 35 U.S.C. 154(b) by 338 days.

This patent is subject to a terminal disclaimer.

(21) Appl. No.: 18/325,324

(22) Filed: May 30, 2023

(65) Prior Publication Data

US 2023/0386879 A1    Nov. 30, 2023

Related U.S. Application Data

(63) Continuation of application No. 17/136,661, filed on Dec. 29, 2020, now Pat. No. 11,664,259, which is a continuation of application No. 15/369,573, filed on Dec. 5, 2016, now Pat. No. 10,879,101, which is a continuation of application No. 14/325,702, filed on Jul. 8, 2014, now Pat. No. 9,514,974.

(60) Provisional application No. 61/843,685, filed on Jul. 8, 2013.

(51) Int. Cl.
    *H10P 72/00*      (2026.01)
    *H10P 72/50*      (2026.01)
    *H10P 72/30*      (2026.01)
(52) U.S. Cl.
    CPC .......... *H10P 72/0606* (2026.01); *H10P 72/53* (2026.01); *H10P 72/0608* (2026.01); *H10P 72/3406* (2026.01); *Y10S 414/136* (2013.01)

(58) Field of Classification Search
    CPC ............. H01L 21/67259; H01L 21/681; H10P 72/0606; H10P 72/53
    See application file for complete search history.

(56) References Cited

U.S. PATENT DOCUMENTS

| | | | |
|---|---|---|---|
| 4,819,167 A | 4/1989 | Cheng et al. | |
| 5,980,194 A | 11/1999 | Freerks et al. | |
| 6,013,920 A | 1/2000 | Gordon et al. | |
| 6,075,334 A | 6/2000 | Sagues et al. | |
| 6,291,814 B1 | 9/2001 | Chuang et al. | |

(Continued)

FOREIGN PATENT DOCUMENTS

| | | |
|---|---|---|
| JP | 2001068530 | 3/2001 |
| JP | 2003273190 | 9/2003 |

(Continued)

OTHER PUBLICATIONS

International Search Report, International Application No. PCT/US2014/045725, dated Nov. 27, 2014.

*Primary Examiner* — James Keenan
(74) *Attorney, Agent, or Firm* — Perman & Green, LLP

(57) ABSTRACT

A substrate processing apparatus including a frame defining a chamber with a substrate transport opening and a substrate transfer plane defined therein, a valve mounted to the frame and being configured to seal an atmosphere of the chamber when closed, the valve having a door movably disposed to open and close the substrate transport opening, and at least one substrate sensor element disposed on a side of the door and oriented to sense substrates located on the substrate transfer plane.

20 Claims, 15 Drawing Sheets

(56) References Cited

U.S. PATENT DOCUMENTS

| | | | |
|---|---|---|---|
| 6,452,201 | B1 | 9/2002 | Wang et al. |
| 6,553,280 | B2 | 4/2003 | Johnson et al. |
| 6,990,430 | B2 | 1/2006 | Hosek |
| 7,109,509 | B2 | 9/2006 | Glichrist et al. |
| 7,255,524 | B2 | 8/2007 | Hofmeister et al. |
| 7,379,174 | B2 | 5/2008 | Miyajima et al. |
| 7,458,763 | B2 | 12/2008 | van der Meulen |
| 7,618,226 | B2 | 11/2009 | Takizawa et al. |
| 7,677,859 | B2 | 3/2010 | Gilchrist et al. |
| 7,720,558 | B2 | 5/2010 | Elliott et al. |
| 7,880,155 | B2 | 2/2011 | Krupyshev et al. |
| 7,925,378 | B2 | 4/2011 | Gilchrist et al. |
| 7,933,665 | B2 | 4/2011 | Sakiya et al. |
| 7,963,736 | B2 | 6/2011 | Takizawa et al. |
| 8,002,511 | B2 | 8/2011 | Kamikawa et al. |
| 8,272,825 | B2 | 9/2012 | Hofmeister et al. |
| 8,398,355 | B2 | 3/2013 | Holtkamp et al. |
| 8,462,008 | B2 | 6/2013 | Lee |
| 8,462,009 | B2 | 6/2013 | Lee |
| 8,600,150 | B2 | 12/2013 | Lee et al. |
| 9,514,974 | B2 | 12/2016 | Sharrock |
| 10,879,101 | B2 | 12/2020 | Sharrock |
| 2002/0081177 | A1 | 6/2002 | Johnson et al. |
| 2003/0167102 | A1 | 9/2003 | Johnson et al. |
| 2007/0004058 | A1 | 1/2007 | Lee et al. |
| 2009/0003976 | A1 | 1/2009 | Hofmeister et al. |
| 2009/0169344 | A1 | 7/2009 | Nozawa et al. |
| 2009/0192633 | A1 | 7/2009 | Schauer |
| 2013/0078057 | A1 | 3/2013 | Hofmeister et al. |

FOREIGN PATENT DOCUMENTS

| | | |
|---|---|---|
| JP | 2005297072 | 10/2005 |
| JP | 2006294642 | 10/2006 |
| JP | 2007019110 | 1/2007 |
| JP | 2007311832 | 11/2007 |
| KR | 1020070001636 | 1/2007 |
| KR | 1020080073914 | 8/2008 |
| KR | 1020100022060 | 2/2010 |
| KR | 1020100137429 | 12/2010 |
| WO | 2008144670 | 11/2008 |

PROCESS APPARATUS WITH ON-THE-FLY SUBSTRATE CENTERING

CROSS-REFERENCE TO RELATED APPLICATIONS

This application is a continuation of U.S. application Ser. No. 17/136,661, filed Dec. 29, 2020 (now U.S. Pat. No. 11,664,259), which is a continuation of U.S. patent application Ser. No. 15/369,573, filed Dec. 5, 2016, (now U.S. Pat. No. 10,879,101), which is a continuation of U.S. application Ser. No. 14/325,702, filed Jul. 8, 2014, (now U.S. Pat. No. 9,514,974) which is a non-provisional of and claims the benefit of U.S. Provisional Patent Application No. 61/843,685, filed on Jul. 8, 2013, the disclosures of which are incorporated by reference herein in their entireties.

BACKGROUND

1. Field

The exemplary embodiments generally relate to substrate processing apparatus and, more particularly, substrate processing apparatus with substrate centering.

2. Brief Description of Related Developments

Typical manufacturing processes for semiconductor integrated circuits may utilize robotic manipulators to cycle substrates, for example, circular silicon wafers (or any other suitable substrates), through pre-determined sequences of operations in fully automated processing equipment. Substrates may be delivered to the substrate processing equipment, also referred to as a tool, in standard transportation cassettes which house a batch of one or more substrates stored in slots. Individual substrates may then be transferred from the cassettes by a specialized pick-place robot which may be integrated into the tool. Typically, the robot holds a substrate by means of frictional force between the backside of the substrate and an end effector. In some applications, the force may be supplemented by a controlled suction-cup gripper or active gripping members disposed on the end effector.

As a result of limited, but not negligible, motion of the substrates in the cassettes during transportation, the robot may pick the substrate with undesirable eccentricity or misalignment. The difference between the actual location of the center of the substrate and the specified position on the robot end effector needs to be corrected before the substrate can be processed in the tool. Conventional methods and devices for determination and correction of eccentricity or misalignment of circular substrates may include stationary aligners, aligners built into the robot end effector, and sensors placed externally to or within a chamber through which the substrate is transported by the robot. Placement of the aligners or sensors within the chamber or on the end effector may result in chambers having larger internal volumes to, for example, accommodate the aligners and sensors or the increased size of the end effector.

It would be advantageous to provide an on-the-fly substrate centering/alignment system capable of determining eccentricity and/or misalignment of a substrate passing through a chamber while making the internal volume of the chamber as small as possible.

BRIEF DESCRIPTION OF THE DRAWINGS

The foregoing aspects and other features of the disclosed embodiment are explained in the following description, taken in connection with the accompanying drawings, wherein.

DETAILED DESCRIPTION

In accordance with aspects of the disclosed embodiment, a substrate processing apparatus is provided. The substrate processing apparatus includes one or more slot or isolation valves configured to sense or otherwise detect a substrate passing through the slot valve as will be described in greater detail below for effecting on-the-fly substrate centering/alignment and/or eccentricity (collectively referred to herein as alignment) detection. Locating the alignment sensors within or otherwise on the slot valve allows the internal volume of a chamber to which the slot valve is coupled to be made as small as possible so that only sufficient clearance for the substrate and end effector (and any suitable portion of the robot arm to which the end effector is attached) may be provided within the chamber for the substrate to transit to/from or through the chamber. Although the aspects of the disclosed embodiment will be described with reference to the drawings, it should be understood that the aspects of the disclosed embodiment can be embodied in many forms. In addition, any suitable size, shape or type of elements or materials could be used.

Referring to FIGS. 1A-1D, there are shown schematic views of substrate processing apparatus or tools incorporating the aspects of the disclosed embodiment as disclosed further herein.

Figure 1A:
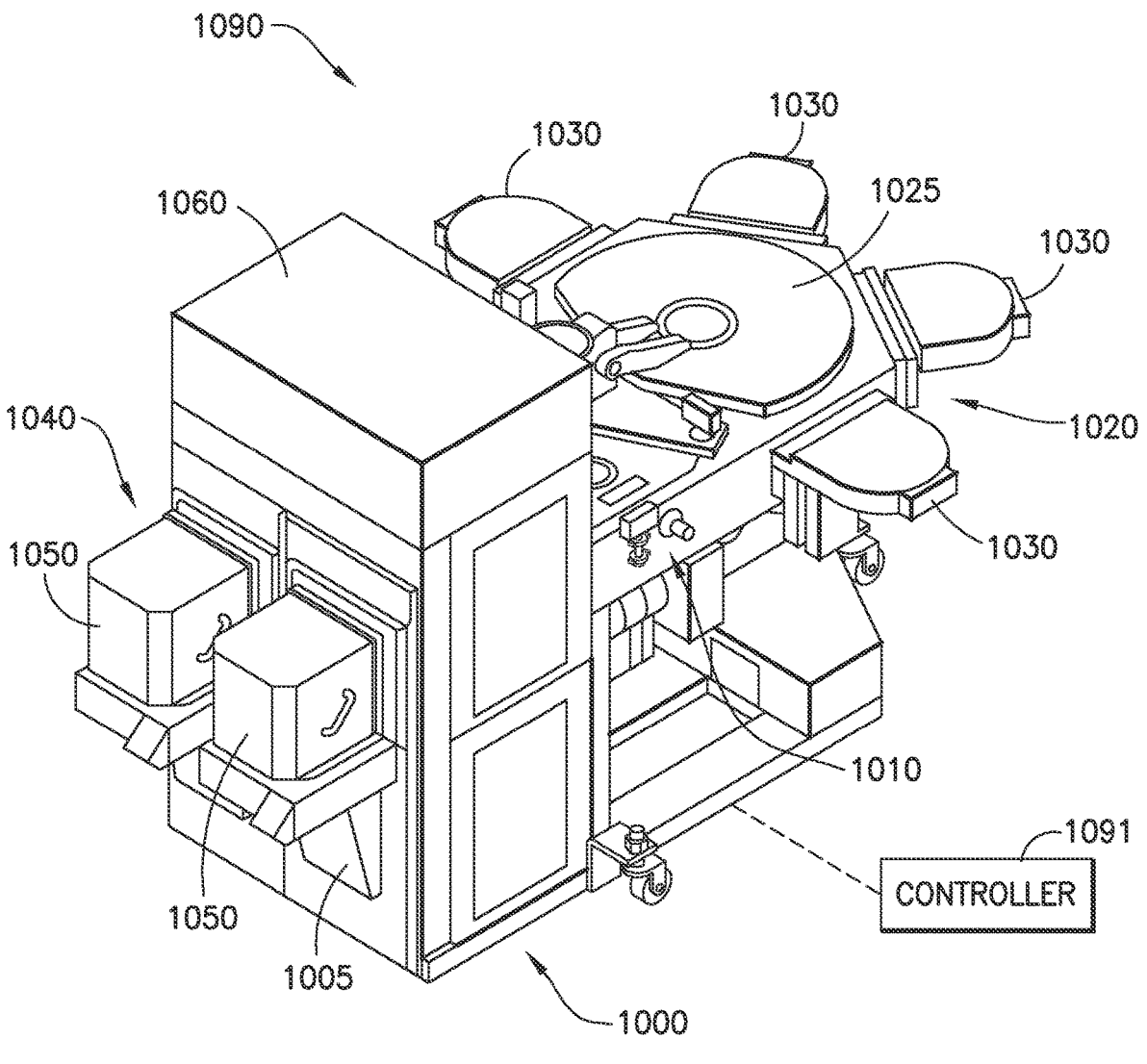
FIGS. 1A-1D are schematic illustrations of substrate processing tools in accordance with aspects of the disclosed embodiment.
Figure 1B:
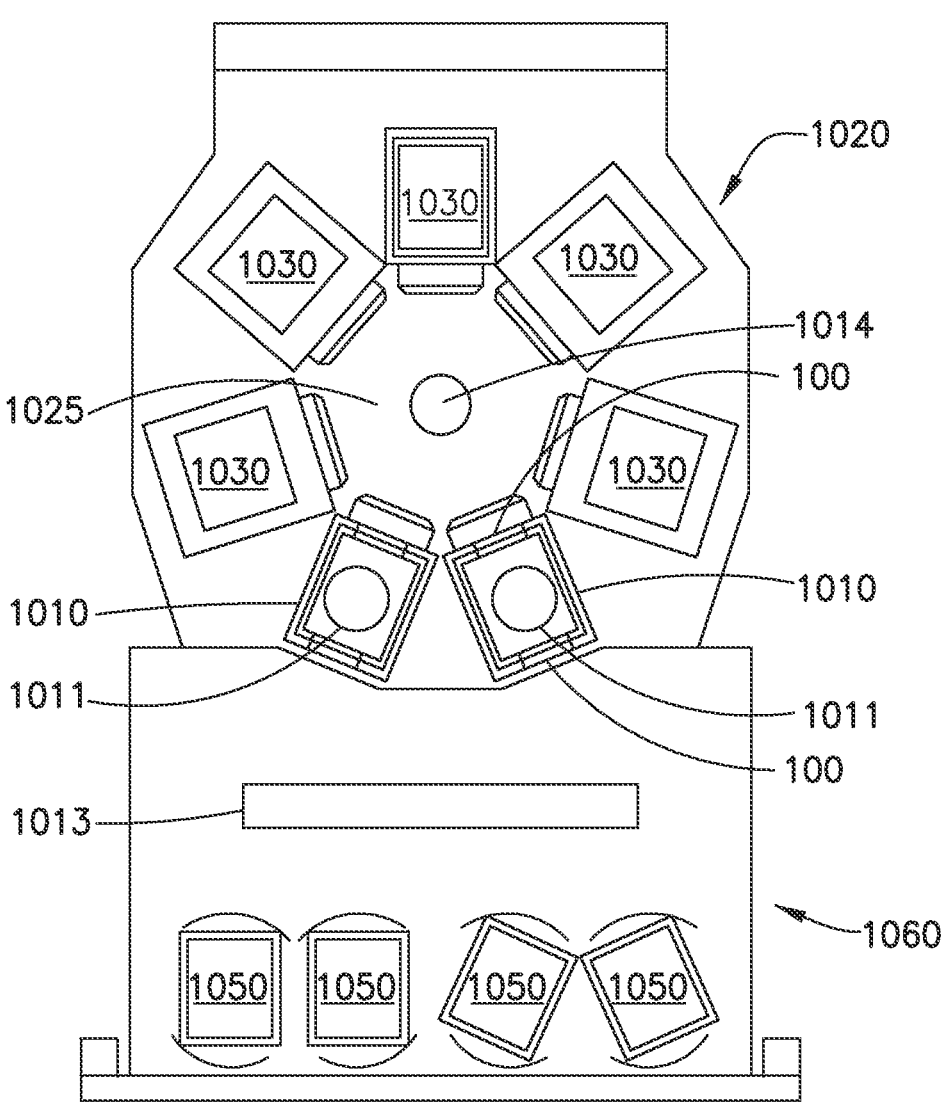

Referring to FIGS. 1A and 1B, a processing apparatus, such as for example a semiconductor tool station 1090 is shown in accordance with an aspect of the disclosed embodiment. Although a semiconductor tool is shown in the drawings, the aspects of the disclosed embodiment described herein can be applied to any tool station or application employing robotic manipulators. In this example the tool 1090 is shown as a cluster tool, however the aspects of the disclosed embodiment may be applied to any suitable tool station such as, for example, a linear tool station such as that shown in FIGS. 1C and 1D and described in U.S. Pat. No. 8,398,355, entitled "Linearly Distributed Semiconductor Workpiece Processing Tool," issued Mar. 19, 2013; U.S.

Pat. No. 7,458,763, entitled "Mid-Entry Load Lock for Semiconductor Handling System," issued Dec. 2, 2008; and U.S. patent application Ser. No. 12/123,329 entitled "Compact Substrate Transport System," filed on May 19, 2008, the disclosures of which are incorporated by reference herein in their entireties. The tool station 1090 generally includes an atmospheric front end 1000, a vacuum load lock 1010 and a vacuum back end 1020. In other aspects, the tool station may have any suitable configuration. The components of each of the front end 1000, load lock 1010 and back end 1020 may be connected to a controller 1091 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 1000 generally includes load port modules 1005 and a mini-environment 1060 such as for example an equipment front end module (EFEM). The load port modules 1005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm, 300 mm or 450 mm wafer interfaces or any other suitable substrate interfaces such as for example larger or smaller wafers or flat panels for flat panel displays. Although two load port modules are shown in FIG. 1A, in other aspects any suitable number of load port modules may be incorporated into the front end 1000. The load port modules 1005 may be configured to receive substrate carriers or cassettes 1050 from an overhead transport system, automatic guided vehicles, person guided vehicles, rail guided vehicles or from any other suitable transport method. The load port modules 1005 may interface with the mini-environment 1060 through load ports 1040. The load ports 1040 may allow the passage of substrates between the substrate cassettes 1050 and the mini-environment 1060 or any other suitable chamber having any suitable atmospheric or vacuum atmosphere therein. The mini-environment 1060 generally includes any suitable transfer robot 1013. In one aspect the robot 1013 may be a track mounted robot such as that described in, for example, U.S. Pat. No. 6,002,840, the disclosure of which is incorporated by reference herein in its entirety. The mini-environment 1060 may provide a controlled, clean zone for substrate transfer between multiple load port modules.

The vacuum load lock 1010 may be located between and connected to the mini-environment 1060 and the back end 1020. It is noted that the term vacuum as used herein may denote an ultra-high vacuum such as $10^{-5}$ Torr or below in which the substrates are processed. The load lock 1010 generally includes atmospheric and vacuum slot valve assemblies 100 (substantially similar to those described herein and generally referred to as valves or slot/isolation valves). The slot valves 100 may provide the environmental isolation employed to evacuate the load lock after loading a substrate from the atmospheric front end and to maintain the vacuum in the transport chamber when venting the lock with an inert gas such as nitrogen. The load lock 1010 may also include an aligner 1011 for aligning a fiducial of the substrate to a desired position for processing. In other aspects, the vacuum load lock may be located in any suitable location of the processing apparatus and have any suitable configuration.

The vacuum back end 1020 generally includes a transport chamber 1025, one or more processing station(s) 1030 and any suitable transfer robot 1014 and may include one or more aspects of the disclosed embodiments described herein. The transfer robot 1014 may be located within the transport chamber 1025 to transport substrates between the load lock 1010 and the various processing stations 1030. The processing stations 1030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 1030 are connected to the transport chamber 1025 to allow substrates to be passed from the transport chamber 1025 to the processing stations 1030 and vice versa.

Figure 1C:
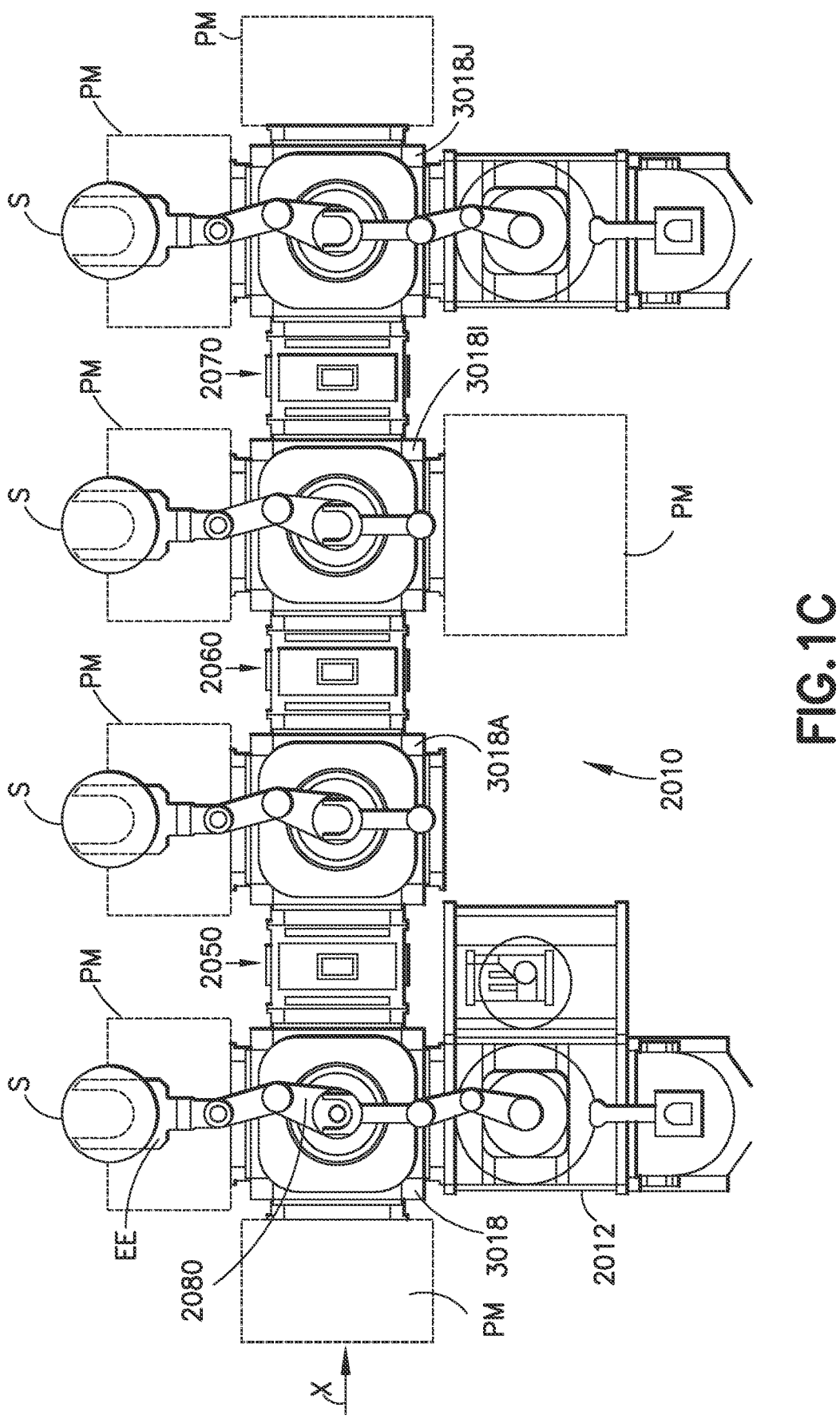

Referring now to FIG. 1C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. It is noted that the interfaces 2050, 2060, 2070 may include one or more slot valves as described herein to, for example, isolate adjacent modules from one another. Each transport chamber module 3018, 3019A, 3018I, 3018J includes any suitable substrate transport 2080 for transporting substrates throughout the processing system 2010 and into and out of, for example, processing modules PM. As may be realized, each chamber module may be capable of holding an isolated or controlled atmosphere (e.g. N2, clean air, vacuum).

Figure 1D:
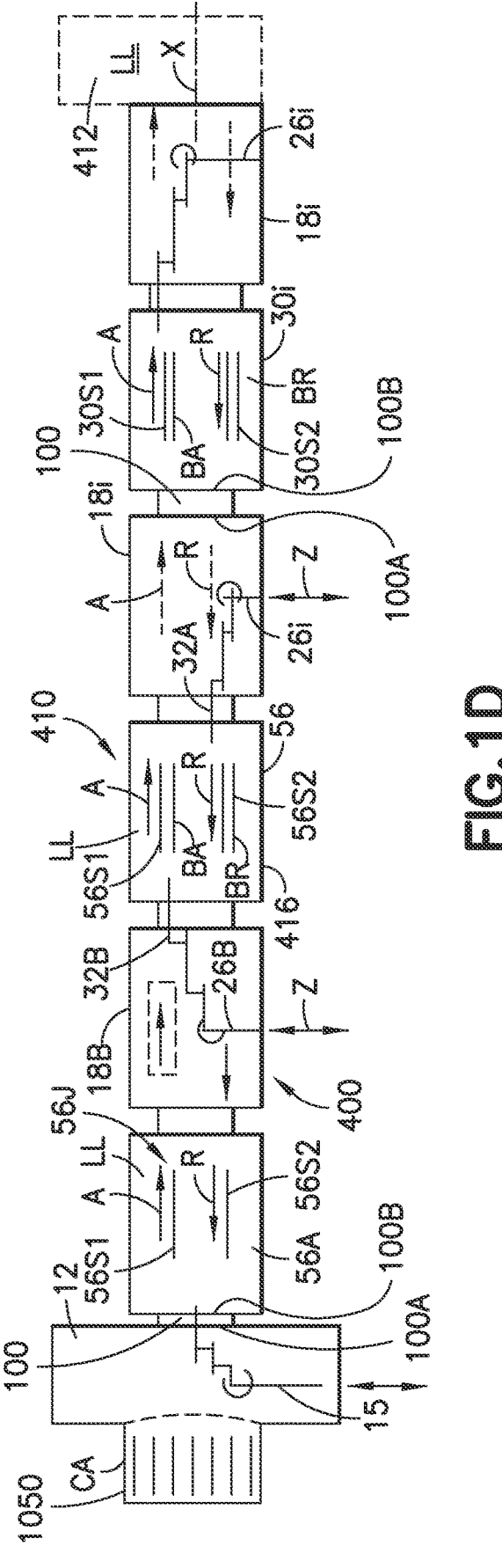

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56B and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18*i*) may be configured to operate as a load lock. As also noted before, transport chamber modules 18B, 18*i* have one or more corresponding transport apparatus 26B, 26*i*, which may include one or more aspects of the disclosed embodiment described herein, located therein. The transport apparatus 26B, 26*i* of the respective transport chamber modules 18B, 18*i* may cooperate to provide the linearly distributed workpiece transport system 420 in the transport chamber. In this aspect, the transport apparatus 26B may have a general SCARA arm configuration (though in other aspects the transport arms may have any other desired arrangement such as a frog-leg configuration, telescopic configuration, bi-symmetric configuration, etc.). In the aspect of the disclosed embodiment shown in FIG. 1D, the arms of the transport apparatus 26B may be arranged to provide what may be referred to as fast swap arrangement allowing the transport to quickly swap wafers from a pick/place location. The transport arm 26B may have a suitable drive section, such as that described below, for providing each arm with any suitable number of degrees of freedom (e.g. independent rotation about shoulder and elbow joints with Z axis motion). As seen in FIG. 1D, in this aspect the modules 56A, 56, 30*i* may be located interstitially between transfer chamber modules 18B, 18*i* and may define suitable processing modules, load lock(s), buffer station(s), metrology station(s) or any other desired station(s). For example the interstitial modules, such as load locks 56A, 56 and workpiece station 30*i*, may each have stationary workpiece supports/shelves 56S, 56S1, 56S2, 30S1, that may cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm of the interface section. The workpiece(s), in load lock module 56A, may be moved between load lock module 56A and load lock module 56 by the transport arm 26B in module 18B, and in a similar and consecutive manner between load lock 56 and workpiece station 30*i* with arm 26*i* (in module 18*i*) and between station 30*i* and station 412 with arm 26*i* in module 18*i*. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18*i*. In such aspects, transport arms of adjoining transport chamber modules may pass off workpieces directly from end effector or one transport arm to end effector of another transport arm to move the workpiece through the transport chamber. The processing station modules may operate on the substrates through various deposition, etching, or other types of processes to form electrical circuitry or other desired structure on the substrates. The processing station modules are connected to the transport chamber modules to allow substrates to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety. As can be seen in FIG. 1A slot valves 100 may be located between and connect adjacent ones of the interfaces 12, 412 and modules 56A, 18B, 416, 18*i*, 30*i* to selectively seal or otherwise isolate each interface or module from other ones of the interfaces or modules.

Figure 2A:
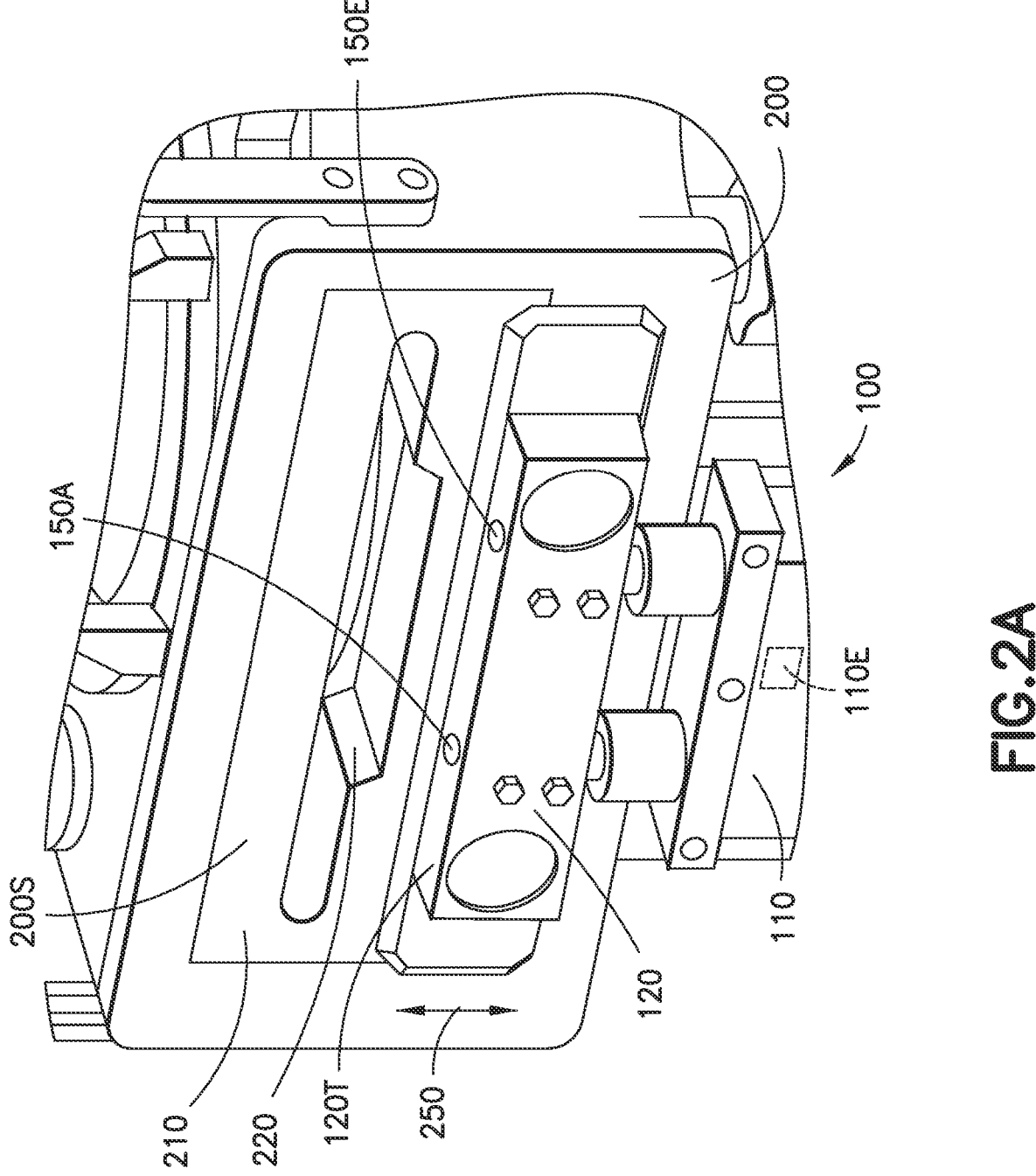
FIGS. 2A and 2B are schematic illustrations of chambers incorporating aspects of the disclosed embodiment.
Figure 2B:
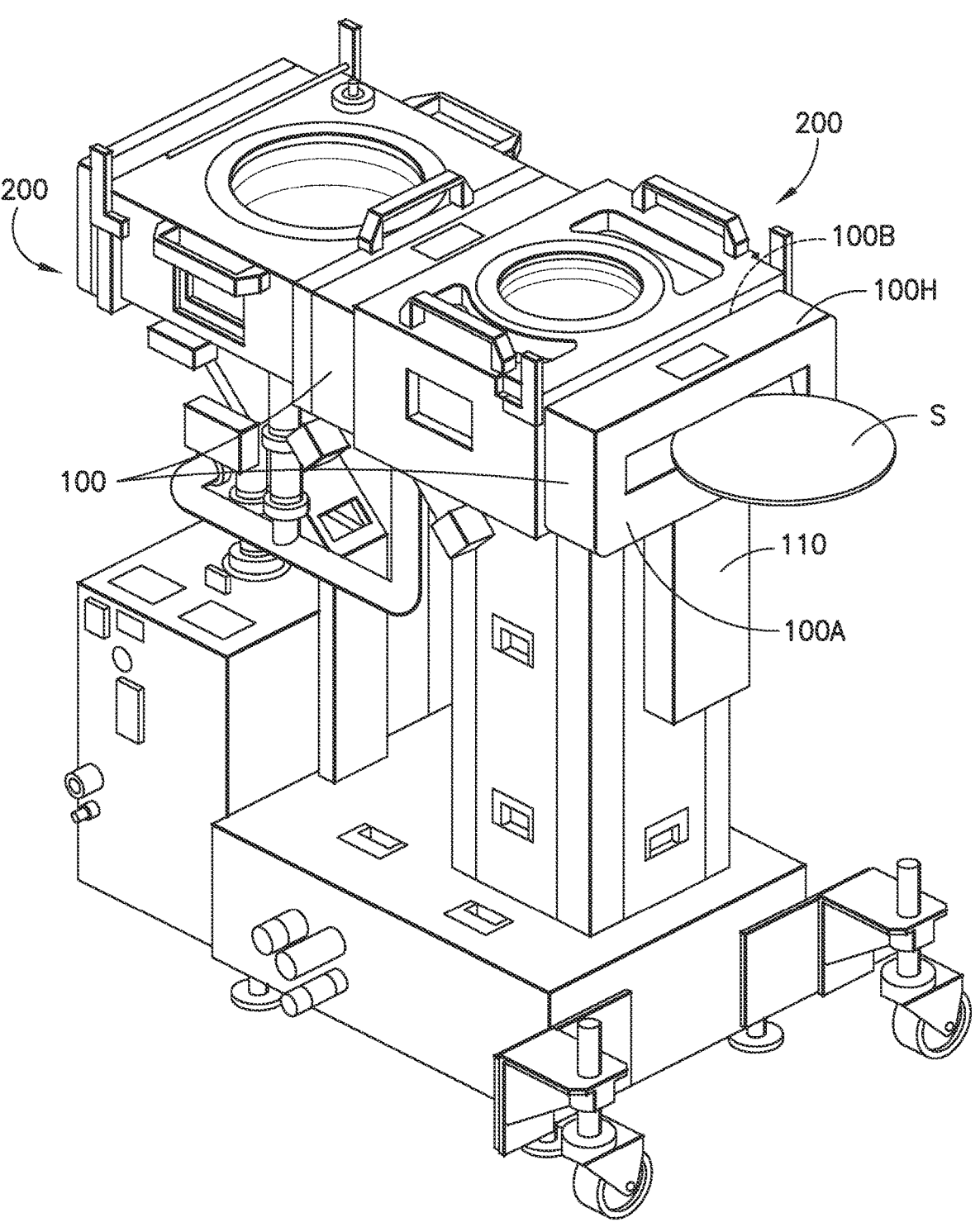
Figure 3:
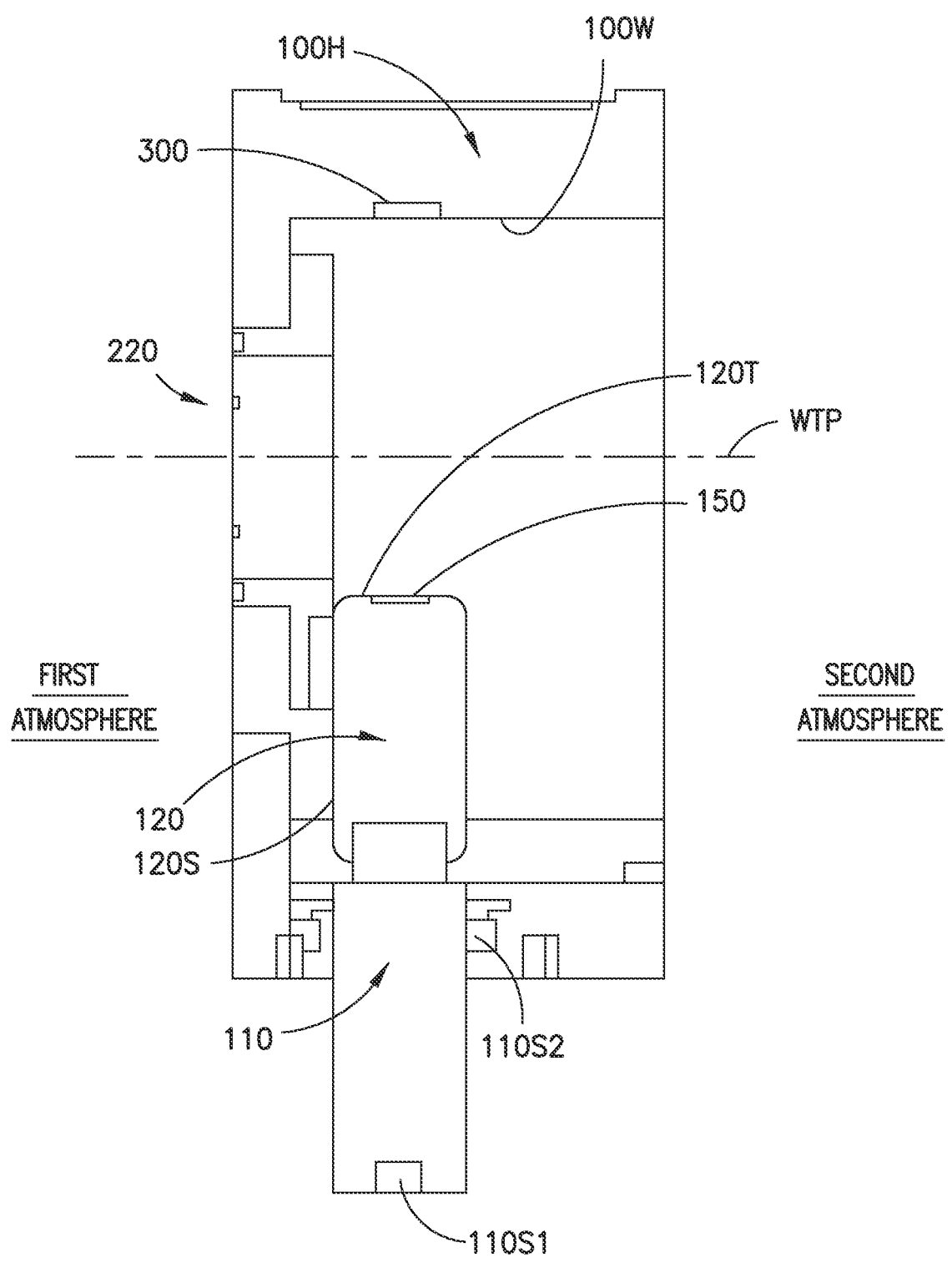
FIGS. 3 and 4 are schematic illustrations of portions of a slot valve in accordance with aspects of the disclosed embodiment.
Figure 4:
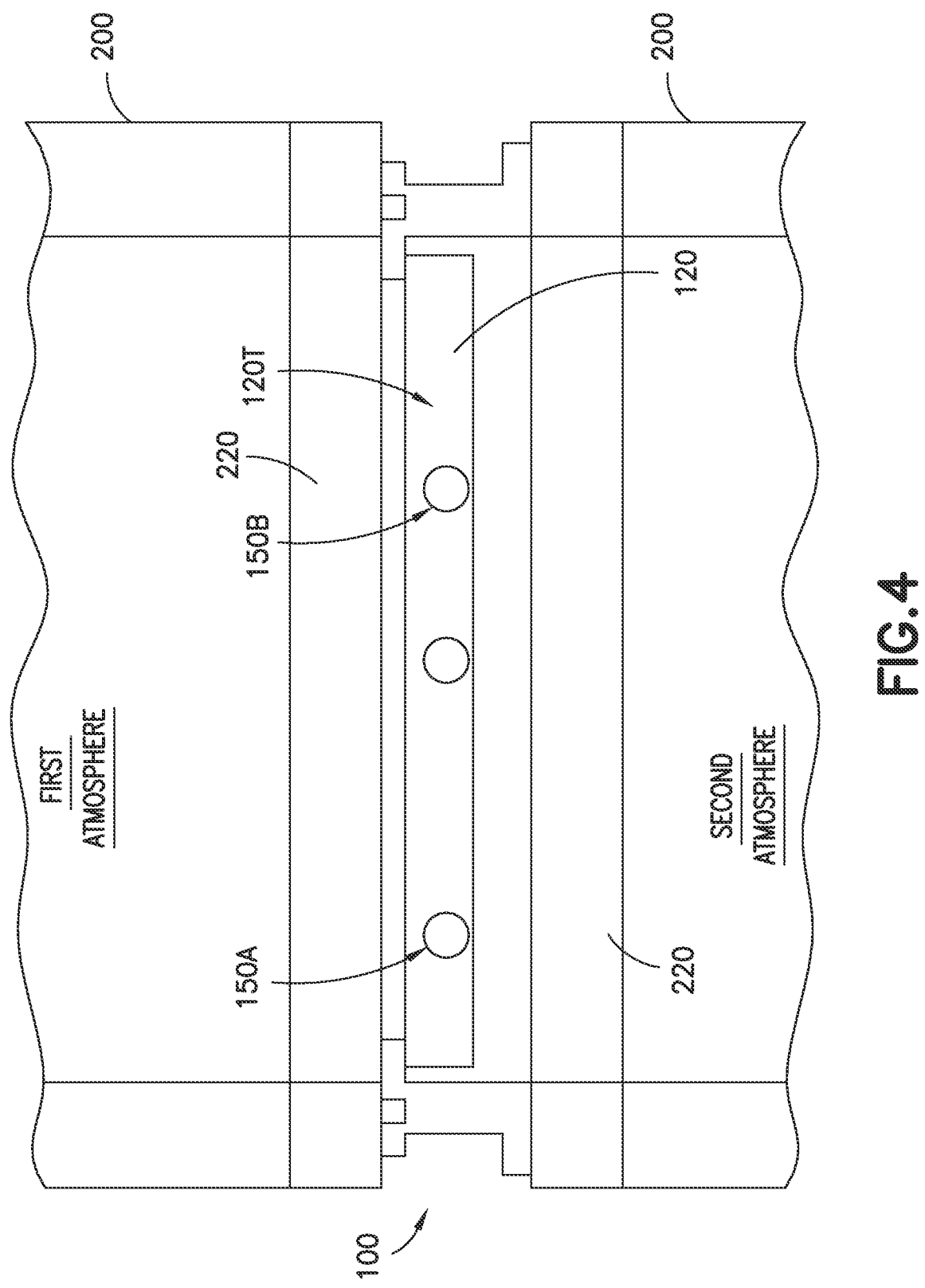

Referring now to FIGS. 1D, 2A and 2B, as noted above, the slot valve 100 may be provided (FIG. 9, Block 900) such that the slot valve is disposed between and connects adjacent modules (or in FIG. 1B be located on one or more sides of load locks 1010) so that the modules can be sealed or isolated from other adjacent modules. Each slot valve 100 may include one or more interfaces 100A, 100B. Referring also to FIGS. 2, 3 and 4, each interface 100A, 100B may be configured for coupling to any suitable module 200 such as those described herein. In one aspect, one interface 100A, 100B may couple the slot valve 100 to an atmospheric environment, such as in an equipment front end module, while the other interface 100A, 100B couples the slot valve 100 to a vacuum environment. In other aspects both interfaces 100A, 100B may couple the slot valve 100 to atmospheric environments or vacuum environments. The slot valve 100 may include a valve body or housing 100H that is configured to cover a substrate transport opening of a substrate holding module or chamber to which the valve 100 is attached. The valve may also include a door assembly that includes a door drive 110, a valve door 120 and at least one sensor element 150 (described in greater detail below). The door drive 110 may be affixed in any suitable manner to the housing 100H and may be coupled to the valve door 120. In one aspect the door assembly may be a modular unit that may be removable from the valve housing 100H as a one piece unit. In another aspect the valve door 120 and the at least one sensing element 150 may be a modular unit that may be removable from the valve housing 100H as a one piece unit. The door 120 may be disposed within the valve body 100H and driven by the door drive 110 within the valve body 100H in any suitable manner and at least in the direction of arrow 250. The movement of the door 120 within the valve body 100B by the door drive 110 may be any suitable one or two axis movement sufficient to move the door 120 over an opening 220 in the module 200 so that the opening 220 is sealed by the door 120 for isolating an interior of the module 200. The movement of the door 120 within the valve body 100H by the door drive 110 may also be sufficient to move the door 120 away from the opening 220 in the module 200 so that a substrate S carried by, for example, an end effector EE (see FIG. 1C), or any other suitable portion, of a transport robot can pass through the opening 220. In one aspect the door 120 may be configured to interface with a sealing surface 200S of the module 200 for sealing the opening 220 while in other aspects, as shown in FIG. 2A, the door may be configured to interface with a module insert 210 (on which the sealing surface 200S is disposed) that can be removed and replaced due to, for example, wear caused interaction between the door 120 and the module insert 210. In other aspects the slot valve may be integral to at least one of the modules. For example a frame of one of the modules may form the valve body and be configured for coupling to another of the modules such that the valve seals the passage through the valve body in a manner substantially similar to that described above.

Referring also to FIGS. 3 and 4 one or more suitable substrate detection sensor elements 150A, 150B (generally referred to as sensor elements 150) may be provided or otherwise placed (e.g. located/mounted) on, for example, any suitable side of the door 120 for effecting on-the-fly wafer alignment. In this aspect the sensor elements 150 are illustrated as being mounted on a side 120T of the door such that the sensor elements are oriented to sense substrates located on a substrate transfer plane WTP (FIG. 3). As seen in FIGS. 3 and 4 the sensor elements are illustrated on the top side of the door however, in other aspects the sensor elements may be disposed on the lateral sides (e.g. extending between the top and a bottom) of the door (e.g. substantially perpendicular to a substrate transfer plane WTP extending through the valve body), the front side of the door, the back side of the door and/or the bottom (e.g. opposite the top) side of the door. In one aspect the sensor elements may be disposed so they are substantially perpendicular to or otherwise face the substrate transfer plane WTP at any suitable angle. The wafer transfer plane WTP may pass through and be defined by one or more of the valve body 100H and the opening 220 of the modules to which the valve body is coupled. In this aspect two sensor elements 150A, 150B are illustrated as being located on side 120T but in other aspects more or less than two sensor elements may be provided on the side 120T. Suitable examples of sensors and sensor arrangements which may be located on the door 120 are described in, for example, U.S. Pat. No. 7,925,378 entitled "Process Apparatus with On-The-Fly Workpiece Centering," issued on Apr. 12, 2011; U.S. Pat. No. 7,880,155 entitled "Substrate Alignment Apparatus Comprising a Controller to Measure Alignment During Transport," issued on Feb. 1, 2011; U.S. Pat. No. 7,925,378 entitled "Process Apparatus with On-The-Fly Workpiece Centering," issued on Apr. 12, 2011; U.S. Pat. No. 6,990,430 entitled "System and Method for On-The-Fly Eccentricity Recognition" issued on Jan. 24, 2006; and U.S. Pat. No. 4,819,167 entitled "System and Method for Detecting the Center of an Integrated Circuit Wafer" issued on Apr. 4, 1989, the disclosures of which are incorporated herein by reference in their entireties. As may be realized, in one aspect the sensor elements 150 may be configured in any suitable manner for operation in a vacuum environment. For example, a view port or any other suitable sealing members may be provided on the door 120 to isolate any suitable portion of the sensing elements from the vacuum environment. In other aspects the sensor elements 150 may be suitably configured for operation within an atmospheric environment.

The one or more sensor elements 150 may be any suitable sensor elements such as, for example, optical, capacitive and/or inductive sensor elements. In one aspect each sensor element 150 may include, in the case of at least the optical (or other suitable beam or reflective) sensor elements, an emitter and a receiver pair disposed in a common housing. In another aspect the sensor elements 150A, 150B may form a sensor pair such that sensor element 150A may be an emitter and the sensor element 150B may be a receiver or vice versa. In still other aspects, there may be one or more corresponding sensor elements 300 (such as emitters, receivers, reflectors, etc.) disposed on an interior surface 100W (or any other suitable surface) of the valve body 100H that communicably interface with respective ones of the sensor elements 150 in any suitable manner so that the one or more sensor elements 300 and the respective sensor elements 150 form one or more respective sensor pairs. As may be realized, the sensor elements 300 may, in other aspects, be disposed on an outside surface of the valve body 100H and communicate with one or more respective sensor elements 150 through a view port or in any other suitable manner. As may also be realized, where sensing elements 300 are positioned on an interior and/or exterior surface of the valve body 100H to communicably interface with the sensor elements 150, in one aspect, the sensor elements 150 may be reflectors that reflect an emissive signal from the respective sensing elements 300 back to a receiver of the respective sensing elements 300. In other aspects the sensor elements 300 may be reflectors that reflect an emissive signal from the respective sensing elements 150 back to a receiver of the sensing elements 150.

Figure 9:
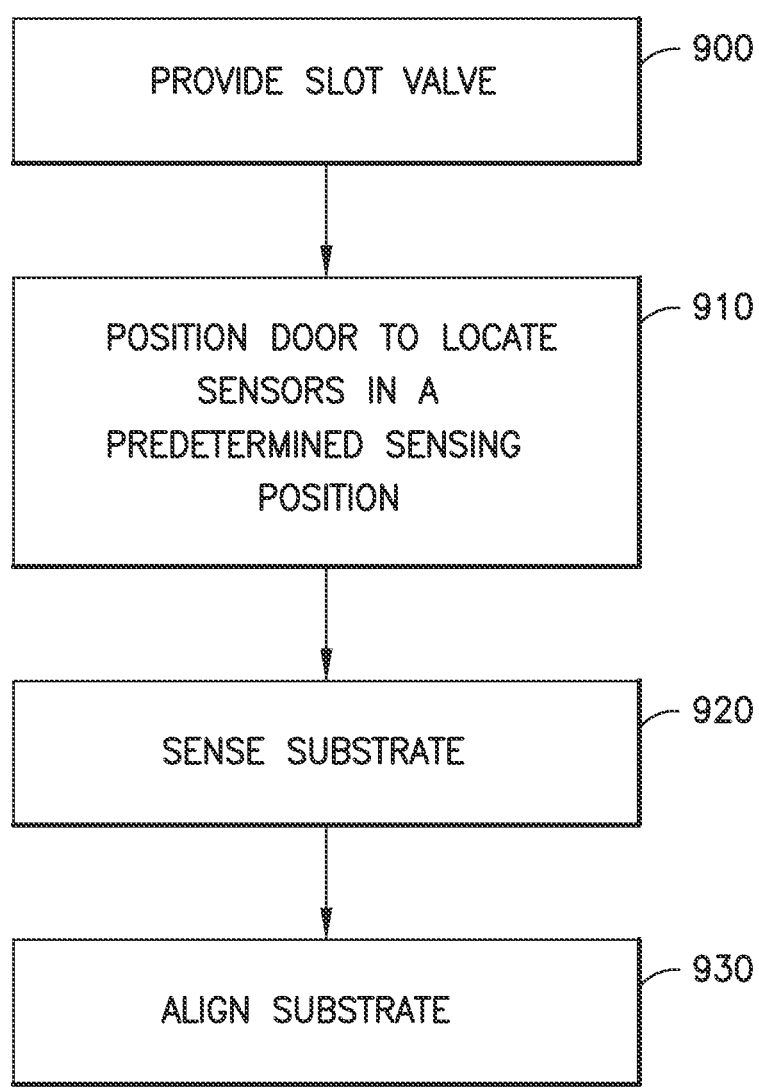
FIG. 9 is a flow chart in accordance with aspects of the disclosed embodiment.

Referring still to FIGS. 2A and 3, the door drive 110 may be mechanically and/or electronically configured to position the door 120 so that the one or more sensing elements 150 (e.g. when the door is open) are located in a predetermined sensing position (FIG. 9, Block 910) for sensing/detecting substrates S passing through the valve body 110H along the substrate transfer plane WTP (FIG. 9, Block 920). In other aspects, the door drive 110 may be configured to position the door 120 so that the one or more sensing elements 150 are in a predetermined position relative to the respective sensing elements 300 (e.g. when the door is open) for sensing substrates S passing through the valve body 110H along the substrate transfer plane WTP. In either aspect, as noted above, the door drive 110 may be, for example, a multi-axis drive configured to, when opening the door, move the door away from the sealing surface 200S and opening 220 so that opening 220 is unobstructed to allow for the passage of substrates S along the substrate transfer plane WTP.

In one aspect, the door drive 110 may include one or more mechanical hard stops 110S1, 110S2 positioned to mechanically arrest or otherwise controllably stop movement of the door 120 along one or more axes of movement for positioning the sensing elements 150 disposed on the door 120 in the predetermined sensing position. In other aspects the door drive 110 may include soft stops for positioning the sensing elements 150 in the predetermined sensing position. For example, the door drive 110 may include one or more suitable encoders 110E configured to determine, along with any suitable controller such as controller 1091, the position of the door 120 along one or more axes of movement such that the drive unit 110 stops under the control of the controller and the sensing elements 150 are located at the predetermined sensing position.

Figure 4A:
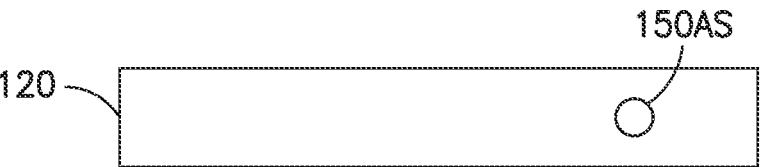
FIGS. 4A-4D are schematic illustrations of portions of a slot valve in accordance with aspects of the disclosed embodiment.

When disposed at the predetermined sensing position, the one or more sensing elements 150 alone or in combination with sensing elements 300 may detect and effect, along with any suitable controller such as controller 1091 (e.g. the controller receives suitable sensing data from the sensing elements), on-the-fly substrate alignment (e.g. alignment of the substrate with a any suitable substrate holding location) in any suitable manner (FIG. 9, Block 930) such as, for example, in the manner described in U.S. Pat. Nos. 7,925, 378; 7,880,155; 7,925,378; 6,990,430; and/or 4,819,167 the disclosures of which have been previously incorporated herein by reference in their entireties. For example, referring to FIG. 4A, one or more sensors 150AS (e.g. where each of the one or more sensors includes a two sensing elements forming a sensor pair capable of detecting a substrate or a single sensing element capable of detecting a substrate as described above) may be positioned on the door 120 for detecting a substrate S passing along the substrate transfer plane WTP. In this aspect one sensor 150AS (in other aspects more than one sensing element can be provided) capable of detecting a substrate S is suitably positioned on the door 120 for effecting centering/alignment of the substrate S in a manner substantially similar to that described in U.S. Pat. No. 7,925,378.

Figure 4B:
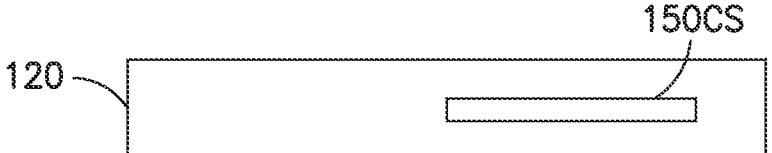

In another aspect, referring to FIG. 4B, one or more sensors 150CS (e.g. where each of the one or more sensors includes a two sensing elements forming a sensor pair capable of detecting a substrate or a single sensing element capable of detecting a substrate as described above) having any suitable cross section for detecting, for example, any suitable area of a substrate S moving along the substrate transfer plane WTP is provided on the door 120 at any suitable position. Here the sensor 150CS may be, for example, a beam sensor where the sensor beam has any suitable cross section. Here the sensor beam may have a rectangular cross section but in other aspects the sensor beam may have any suitable distributed shape effecting centering/alignment of the substrate S in a manner substantially similar to that described in U.S. Pat. No. 7,880,155.

In yet another aspect, two or more sensors 150AS, 150BS (e.g. where each of the one or more sensors includes two sensing elements forming a sensor pair capable of detecting a substrate or a single sensing element capable of detecting a substrate as described above) are provided on the door in any suitable positions for detecting a substrate S moving along the substrate transfer plane WTP. In this aspect the sensors 150AS, 150BS may be positioned at any suitable distances DA, DB from, for example, a centerline of the substrate transfer plane WTPCL (e.g. the line along which the center of the substrate S is expected to travel along). Here sensor 150AS is shown on one side of the centerline WTPCL and the sensor 150BS is shown on the opposite side of the centerline but in other aspects the sensors 150AS, 150BS may be disposed on a common side of the centerline WTPCL. The sensors 150AS, 150BS may also be disposed any suitable distance DX from each other along (e.g. relative to) a direction of substrate travel along the substrate transfer plane WTP. In one aspect the distance DX may be substantially zero (e.g. so the sensors are in-line with each other) while in other aspect the distance may be any suitable distance greater than zero. The sensors 150AS, 150BS, along with any suitable controller such as controller 1091, may be configured to effect centering/alignment of the substrate S in a manner substantially similar to that described in U.S. Pat. No. 6,990,430.

Figure 4C:
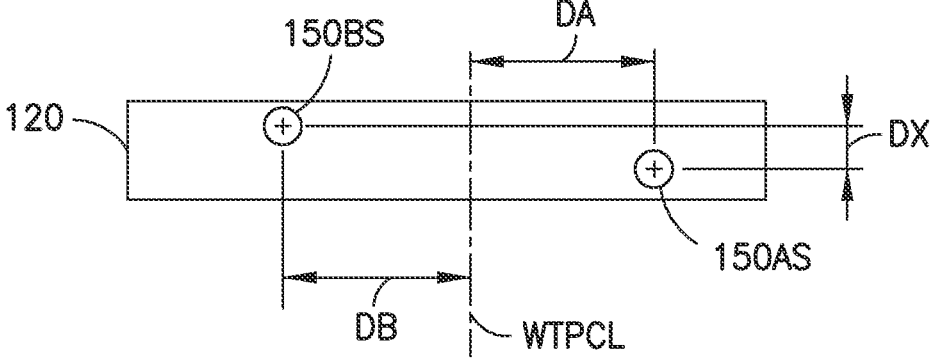
Figure 4D:
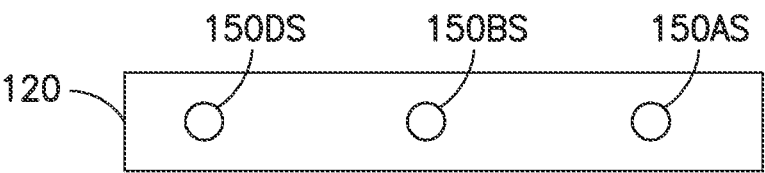

In still another aspect, three or more sensors 150AS, 150BS, 150DS (e.g. where each of the one or more sensors includes a two sensing elements forming a sensor pair capable of detecting a substrate or a single sensing element capable of detecting a substrate as described above) are provided on the door in any suitable positions for detecting a substrate S moving along the substrate transfer plane WTP. In this aspect the sensors 150AS, 150BS, 150DS are arranged in-line with each other but in other aspects one or more of the sensors may be staggered in a manner similar to that described above with respect to FIG. 4C. Here the sensors 150AS, 150BS, 150DS along with any suitable controller such as controller 1091, may be configured to effect centering/alignment of the substrate S in a manner substantially similar to that described in U.S. Pat. No. 4,819,167.

Figure 5A:
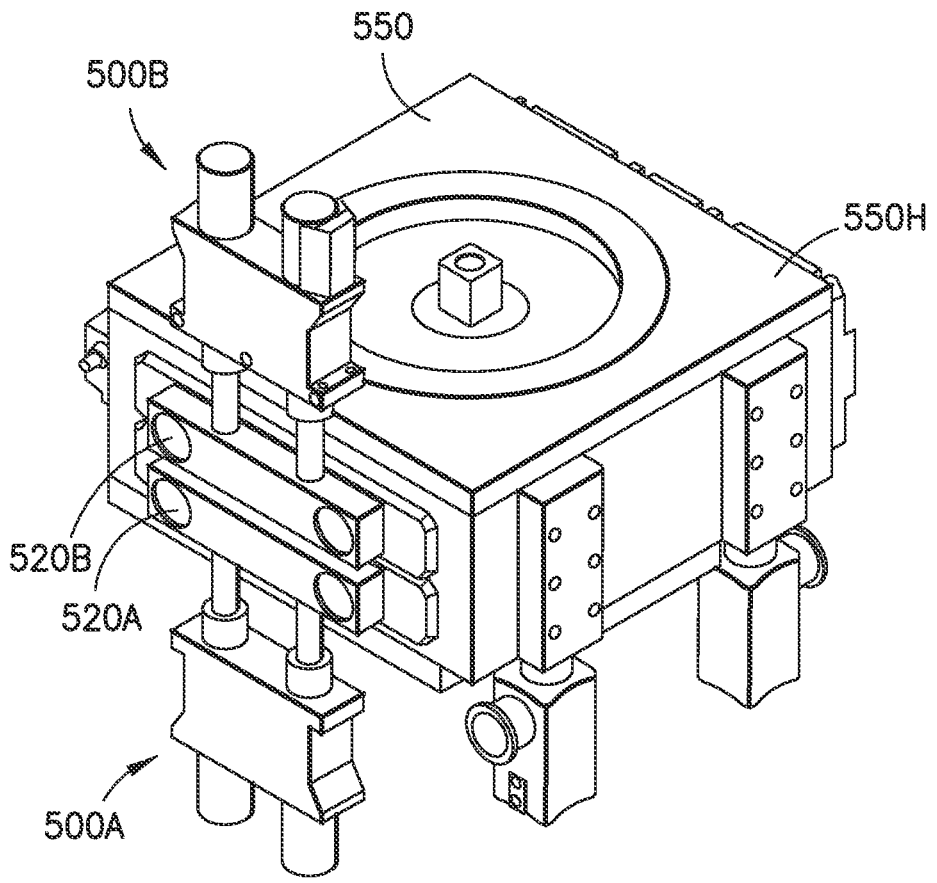
FIGS. 5A and 5B are schematic illustrations of a chamber incorporating aspects of the disclosed embodiment.
Figure 5B:
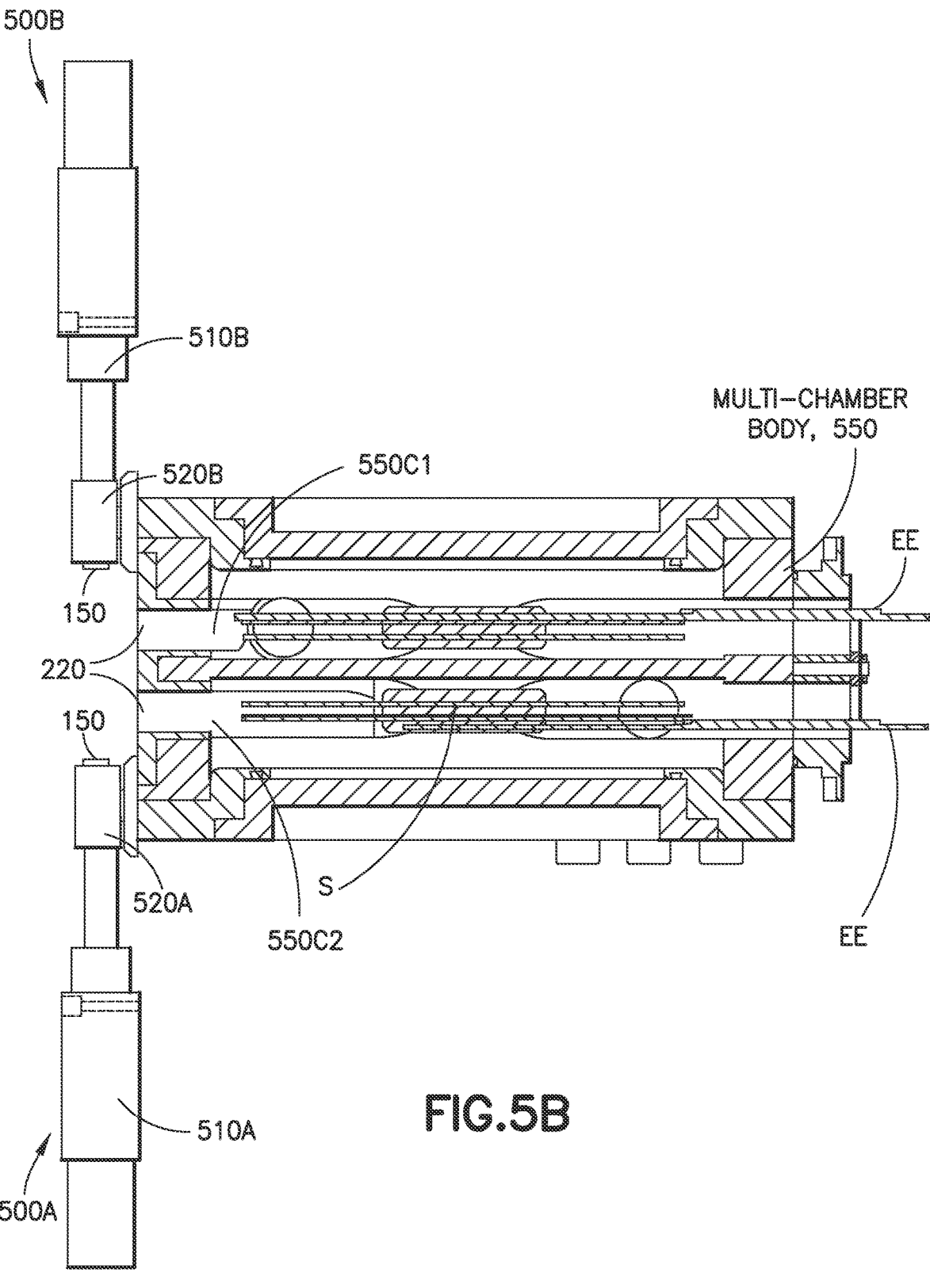

Referring now to FIGS. 5A and 5B, in another aspect chamber 550 may have multiple independently isolatable chambers 550C1, 550C2 within a common housing 550H. Here the chambers 550C1, 550C2 are illustrated as being stacked above one another but in other aspects the chambers 550C1, 550C2 may be disposed side by side. In still other aspects the chambers may be arranged in a two dimensional array. Each chamber 550C1, 550C2 may be substantially similar to those described above in that each chamber includes one or more openings 220 for allowing substrate S passage to and from an interior environment of the chamber 550C1, 550C2. Each opening 220 is provided with a respective slot valve 500A, 500B (the slot valve bodies are omitted in FIGS. 5A and 5B) substantially similar to those described above. In this aspect, the slot valves 500A, 500B for the vertically arranged chambers 550C1, 550C2 are illustrated as being opposed to one another so that when opening the slot valve doors 520A, 520B move away from each other. Suitable arrangements of opposed slot valves (and their door drives which may include door positioning stops/sensors as described herein for allowing the placement of the door sensors in the predetermined sensing position) are described in, for example, U.S. Pat. No. 8,272,825 the disclosure of which has been previously incorporated by reference herein in its entirety.

In this aspect, each door 520A, 520B may include one or more sensing elements 150 (e.g. that form one or more sensors capable of detecting a substrate) as described above. As may be realized, in one aspect each of the sensing elements 150 for the doors 520A, 520B may be configured so that the one or more sensing elements 150 of door 520A are capable of sensing substrates, in a manner substantially similar to that described above, independent of the sensing elements 150 of door 520B. In other aspects, the sensing elements 150 of door 520A may communicably interface with the sensing elements 150 of door 520B in a manner substantially similar to that described above with respect to sensor elements 300. For example, one or more sensing elements 150 of door 520A may form a sensor pair with respective sensing elements 150 of door 520A such that, for example, an emitter is located on door 520A and a receiver is located on door 520B or vice versa. In other aspects, an emitter/receiver may be located on door 520A and a corresponding reflector may be located on door 520B or vice versa.

Figure 6:
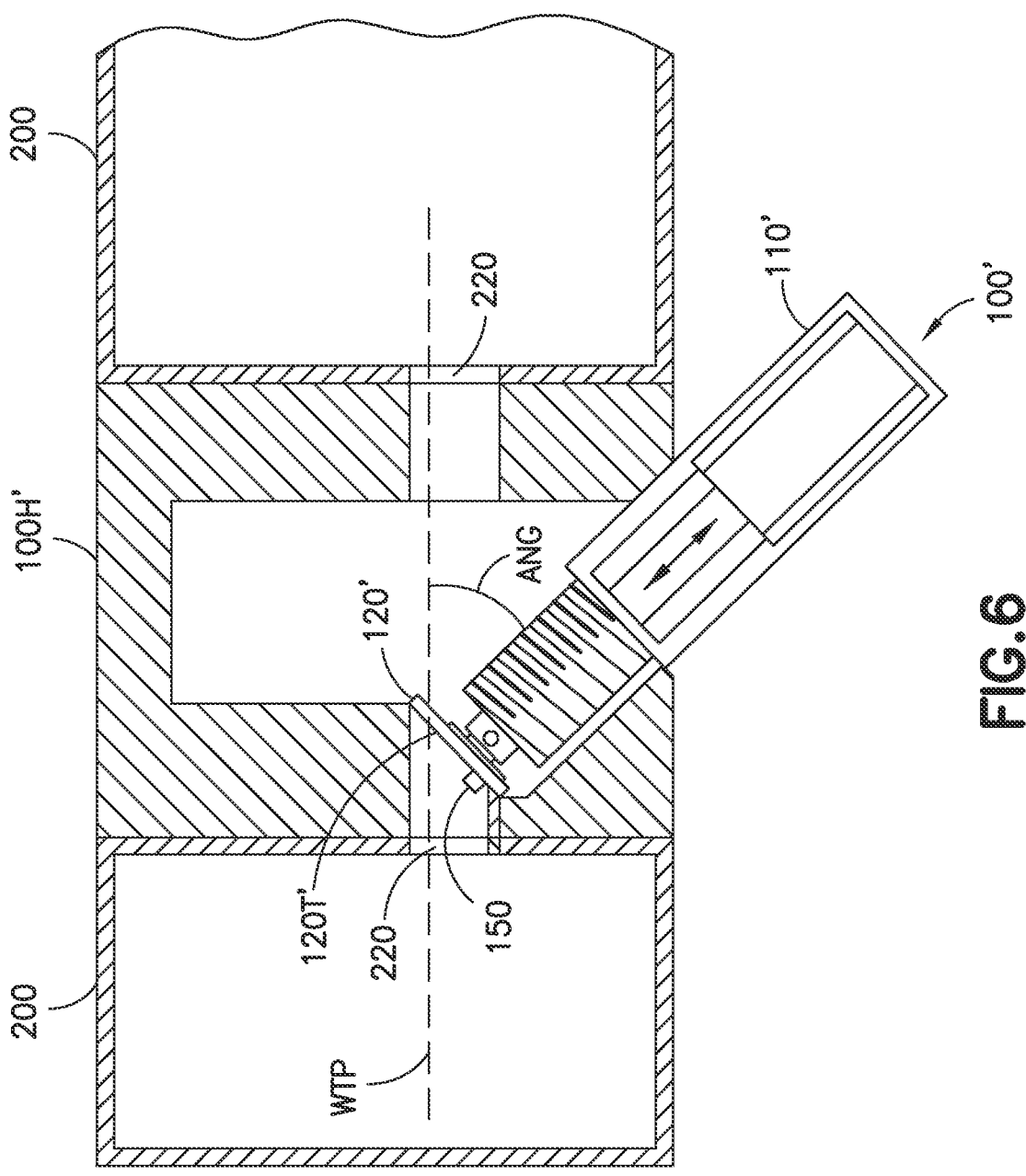
FIG. 6 is a schematic illustration of a portion of a substrate processing tool incorporating aspects of the disclosed embodiment.

In still another aspect of the disclosed embodiment, referring to FIG. 6, the valve 100' may include a housing 100H', a door 120' and a door drive 110'. The valve 100' may be substantially similar to the valves described above however, in this aspect the door 120' and/or the door drive may be oriented at any suitable angle ANG relative to, for example, the substrate transfer plane WTP or any other suitable reference datum within the housing 100H' and/or the substrate holding module 200. In this aspect the at least one substrate sensor element 150 may be located on a side of the door 120T' so that when the door is in an open position (e.g. so that substrates can pass through the opening 220) the at least one substrate sensor element 150 is capable of sensing substrates located on the substrate transfer plane WTP while the substrates are substantially within the substrate holding module 200. In this aspect the at least one substrate sensor element may be configured to, for example, detect at least the leading edge of the substrate. In one aspect, such as where the at least one substrate sensor element 150 includes a beam emitter and receiver the beam may be scattered by the edge of the substrate (such as at a corner or other transition between, e.g., a bottom of the substrate and a side of the substrate spanning between the bottom and a top of the substrate) where the scattered light is received by the receiver.

Figure 7:
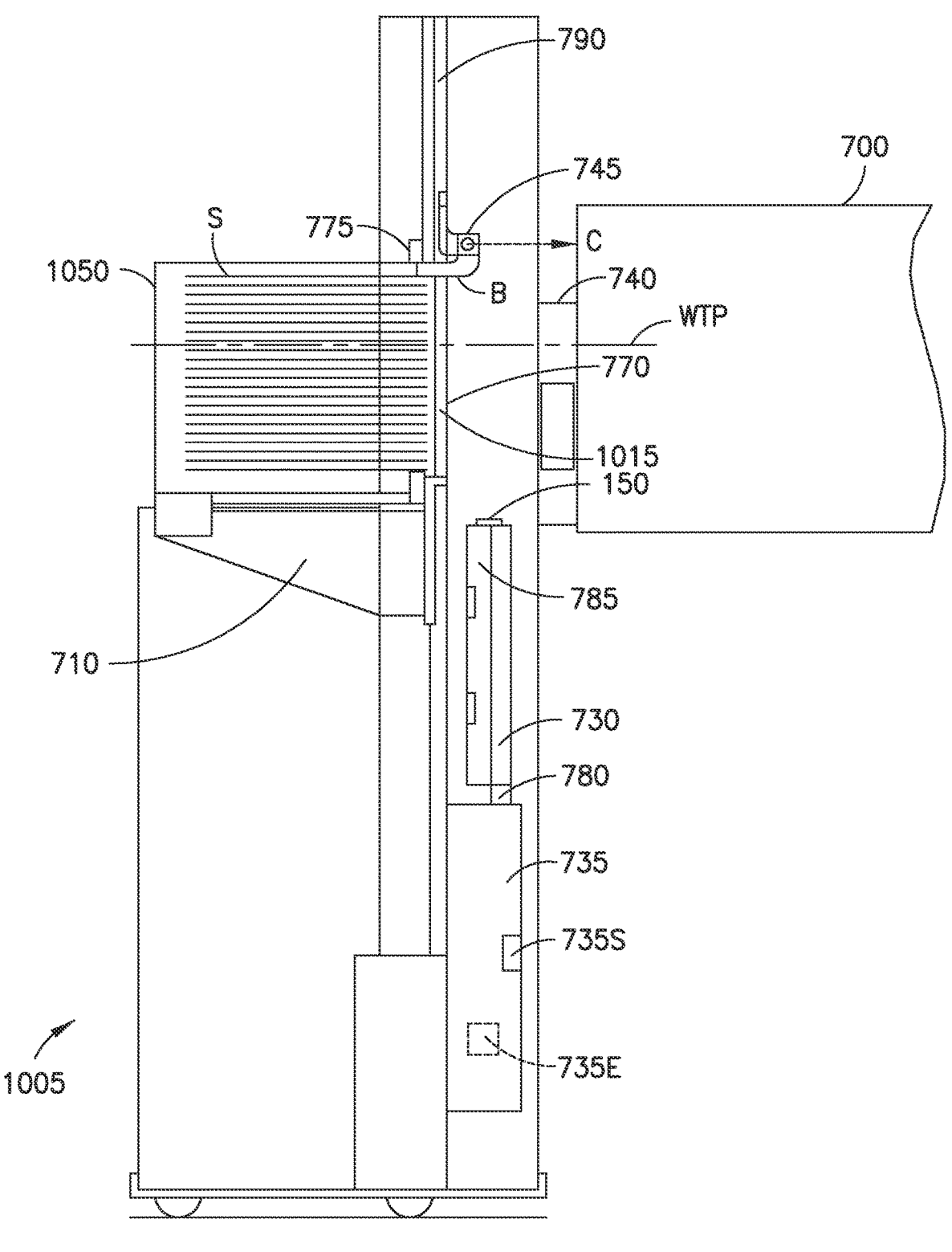
FIGS. 7 and 8 are schematic illustrations of a substrate loading device incorporating aspects of the disclosed embodiments.
Figure 8:
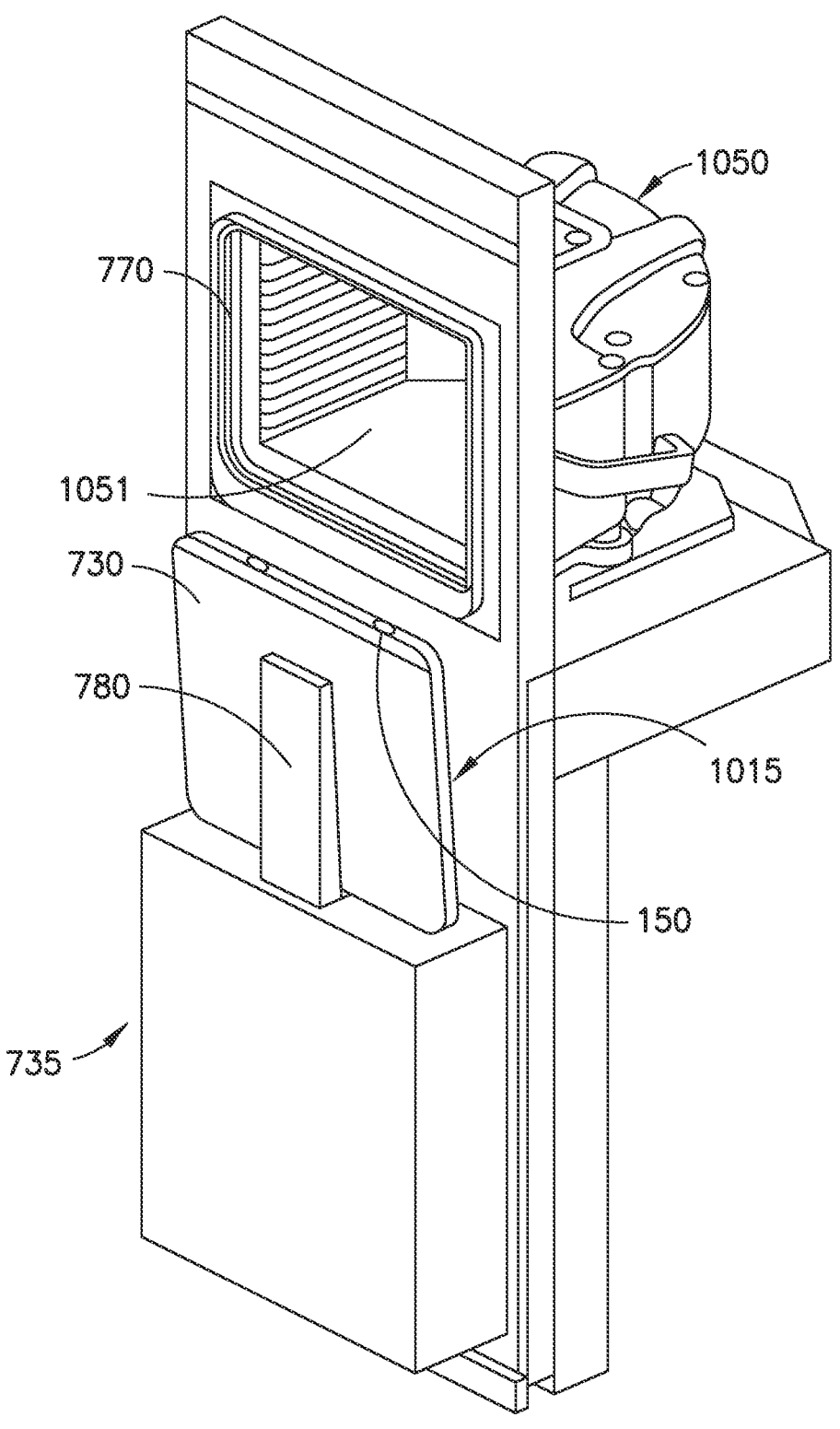

In other aspects, the alignment sensors/system described herein may be employed in any suitable substrate station, such as a load port, so that one or more sensors are disposed on the load port door in a manner substantially similar to that described above with respect to the slot valve 100. For example, referring now to FIGS. 7 and 8 the load port 1005 described above is illustrated in greater detail. Here the load port 1005 is connected in any suitable manner to any suitable chamber 700 which may be substantially similar to those described above (e.g. an EFEM, load lock, transfer chamber, processing chamber, etc.). The load port 1005 may include a substrate cassette table 710 configured to hold one or more substrate cassettes 1050. The substrate cassette table 710 may be movable to effect sealing of the cassette 1050 against any suitable sealing surface of the load port 1005 such as, for example, shield 790. The shield 790 may have an aperture 770 for loading and unloading substrates to/from the cassette 1050. Aperture 770 may be surrounded by a seal 775, against which a cassette opening 1051 may sealingly abut. When cassette opening 1051 is in abutting relationship with seal 775, aperture 770 may be aligned with cassette opening 1051.

The load port 1050 may have a cassette door drive 735, shown in a retracted position, for sealing aperture 770 when cassette opening 1051 is not abutting seal 775, and for coupling to and removing cassette door 1015 when cassette opening 1051 is abutting seal 775. Cassette door drive 735 includes an aperture closure or door 730 mounted on an extendable member 780 which is operated for both translation and pivoting movement by cassette door drive 735. When in an extended position the aperture closure 730 seals aperture 770. The aperture closure 730 includes a door transport 785 for operating any suitable door latch operating mechanism so as to lock or release cassette door 1015 from cassette 1050 and to the support cassette door 1015 during translation and pivoting movements. Door transport 785 includes selectively operable door supports (not shown) which are engageable with cassette door 1015 when cassette opening 1051 is in abutting relationship with seal 775. Substrate station 1050, as noted above, also includes provisions for interfacing to an isolation valve 740, which may be substantially similar to the isolation valves described above, for coupling load port 1050 to chamber 700. Isolation valve 740 is positioned to allow substrates S to be transported along a substrate transfer plane WTP between the cassette 1050 and chamber 700.

The load port 1050 may include any suitable substrate mapper 745 and be configured for mapping the locations of the substrates within the cassette 1050 in a manner substantially similar to that described in U.S. Pat. No. 7,109,509 entitled "Device for the Detection of Substrates Stacked with a Specific Spacing" issued on Sep. 19, 2006; U.S. Pat. No. 7,255,524 entitled "Substrate Cassette Mapper" issued on Aug. 14, 2007; and U.S. Pat. No. 7,677,859 entitled "Substrate Loading and Uploading Station with Buffer" issued on Mar. 16, 2010, the disclosures of which are incorporated herein by reference in their entireties. The load port may also include one or more substrate sensor elements 150. Here the substrate sensor elements 150 may be disposed on a surface of the aperture closure 730 facing the substrate transfer plane WTP in a manner substantially similar to that described above with respect to valve door 120. In a manner substantially similar to that described above, the cassette door drive 735 may include any suitable hard stops 735S or soft stops (including one or more encoders 735E) for stopping the aperture closure 730 and positioning the sensor elements 150 in a predetermined sensing position for detecting and effecting alignment, along with any suitable controller such as controller 1091, of substrates S being transferred to and/or from the cassette

1050 in a manner substantially similar to that described above, such as with respect to FIGS. 4A-4D.

In accordance with one or more aspects of the disclosed embodiment, a substrate processing apparatus is provided. The substrate processing apparatus includes a frame defining a chamber with a substrate transport opening and a substrate transfer plane defined therein and a valve mounted to the frame and being configured to seal an atmosphere of the chamber when closed, the valve having a door movably disposed to open and close the substrate transport opening. At least one substrate sensor element disposed on a side of the door and oriented to sense substrates located on the substrate transfer plane.

In accordance with one or more aspects of the disclosed embodiment the at least one sensor element is facing the substrate transfer plane.

In accordance with one or more aspects of the disclosed embodiment the valve includes a housing with the substrate transfer plane being disposed therethrough.

In accordance with one or more aspects of the disclosed embodiment the valve includes a door drive configured to position the door relative to the wafer transfer plane so that the at least one substrate sensor element is located at a predetermined sensing position for sensing substrates located on the substrate transfer plane.

In accordance with one or more aspects of the disclosed embodiment the door drive includes mechanical stops configured to position the door within the housing so that the at least one substrate sensor element is located at a predetermined sensing position.

In accordance with one or more aspects of the disclosed embodiment substrate processing apparatus includes a controller communicably connected to the door drive where the door drive includes at least one encoder configured to effect, along with the controller, positioning the door within the housing so that the at least one substrate sensor element is located at a predetermined sensing position.

In accordance with one or more aspects of the disclosed embodiment, the at least one substrate sensor element includes one or more of an optical beam sensor element, an optical reflective sensor element, an inductive sensor element, or a capacitive sensor element.

In accordance with one or more aspects of the disclosed embodiment the at least one substrate sensor element comprises a first sensor element disposed on the side of the door and a second sensor element disposed on the housing to form a sensor pair configured to sense the substrates travelling along the substrate transfer plane.

In accordance with one or more aspects of the disclosed embodiment the first sensor element is a reflector and the second sensor element comprises at least one of a beam emitter or beam receiver.

In accordance with one or more aspects of the disclosed embodiment the second sensor element is a reflector and the first sensor element comprises at least one of a beam emitter or beam receiver.

In accordance with one or more aspects of the disclosed embodiment, the substrate processing apparatus comprises a linearly arranged substrate processing tool.

In accordance with one or more aspects of the disclosed embodiment, the substrate processing apparatus comprises a cluster substrate processing tool.

In accordance with one or more aspects of the disclosed embodiment, the substrate processing apparatus includes a second isolation valve having a second door, wherein the door is opposing arranged with the second door and the at least one substrate sensor element comprises a first sensor element disposed on the side of the door and a second sensor element disposed on a side of the second door facing the substrate transfer plane, the first and second sensor element forming a sensor pair configured to sense the substrates travelling along the substrate transfer plane.

In accordance with one or more aspects of the disclosed embodiment the first sensor element is a reflector and the second sensor element comprises at least one of a beam emitter or beam receiver.

In accordance with one or more aspects of the disclosed embodiment the second sensor element is a reflector and the first sensor element comprises at least one of a beam emitter or beam receiver.

In accordance with one or more aspects of the disclosed embodiment, a method of aligning a substrate in a substrate processing apparatus is provided. The method includes providing an isolation valve having at least one sensing element mounted to a door of the isolation valve, positioning the at least one sensing element with the door so that the at least one sensing element is located in a predetermined sensing position relative to a wafer transfer plane, sensing a substrate located on the wafer transfer plane with the at least one sensing element, and receiving data from the at least one sensing element with a controller for effecting alignment of the substrate relative to a substrate holding location.

In accordance with one or more aspects of the disclosed embodiment the method includes positioning the door with mechanical stops so that the at least one substrate sensor element is located at a predetermined sensing position.

In accordance with one or more aspects of the disclosed embodiment the method includes electronically positioning the door so that the at least one substrate sensor element is located at a predetermined sensing position.

In accordance with one or more aspects of the disclosed embodiment, the at least one substrate sensor element includes one or more of an optical beam sensor element, an optical reflective sensor element, an inductive sensor element, or a capacitive sensor element.

In accordance with one or more aspects of the disclosed embodiment, a substrate processing apparatus is provided. The substrate processing apparatus includes a substrate station having an aperture closure for sealing a loading and unloading aperture of the station where the aperture is configured for loading and unloading substrates from a substrate cassette along a substrate transfer plane, an apparatus including a door drive configured to remove a door of the substrate cassette to open the substrate cassette and for operating the aperture closure to open the aperture, and at least one substrate sensing element disposed on a side of the aperture closure and oriented to sense substrates located on the substrate transfer plane.

In accordance with one or more aspects of the disclosed embodiment the at least one substrate sensing element is facing the substrate transfer plane.

In accordance with one or more aspects of the disclosed embodiment the door drive is configured to position the aperture closure so that the at least one substrate sensor element is located, relative to the substrate transfer plane, at a predetermined sensing position for sensing substrates located on the substrate transfer plane.

In accordance with one or more aspects of the disclosed embodiment the door drive includes mechanical stops configured to position the aperture closure so that the at least one substrate sensor element is located at a predetermined sensing position.

In accordance with one or more aspects of the disclosed embodiment substrate processing apparatus includes a controller communicably connected to the door drive where the door drive includes at least one encoder configured to effect, along with the controller, positioning the aperture closure so that the at least one substrate sensor element is located as a predetermined sensing position.

In accordance with one or more aspects of the disclosed embodiment, the at least one substrate sensor element includes one or more of an optical beam sensor element, an optical reflective sensor element, an inductive sensor element, or a capacitive sensor element.

In accordance with one or more aspects of the disclosed embodiment a valve assembly for a substrate processing apparatus is provided. The valve assembly includes a housing configured to cover a substrate transport opening of a substrate holding chamber. The valve assembly further includes a door assembly having a door configured to open and close the substrate transport opening and at least one substrate sensor element located on a side of the door and oriented to sense substrates located on a substrate transfer plane associated with the substrate transport opening.

In accordance with one or more aspects of the disclosed embodiment the door assembly includes a door drive configured to position the door so that the at least one substrate sensor element is located, relative to the substrate transfer plane, at a predetermined sensing position for sensing substrates located on the substrate transfer plane.

In accordance with one or more aspects of the disclosed embodiment the door and the at least one substrate sensor element are removable as a unit from the valve assembly.

In accordance with one or more aspects of the disclosed embodiment the door is configured to seal an atmosphere of the substrate holding chamber when the door is closed where the atmosphere is an ultra-high vacuum.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate processing apparatus comprising:
   a frame defining a chamber with a substrate transport opening and a substrate transfer plane defined therein;
   a valve mounted to the frame and being configured to seal an atmosphere of the chamber when closed, the valve having a closure movably disposed to open and close the substrate transport opening; and
   at least one substrate alignment element disposed proximate a seal edge of the closure and oriented and positioned by the closure so that the at least one substrate alignment element interacts with substrates passing through the substrate transport opening proximate the seal edge located on the substrate transfer plane so that the substrate alignment element registers a substrate centering alignment characteristic, determinative of substrate center alignment relative to a substrate holding station, of the substrates passing through the substrate transport opening on the substrate transfer plane, the substrate holding station being different than the valve.

2. The substrate processing apparatus of claim 1, wherein the at least one substrate alignment element is facing the substrate transfer plane.

3. The substrate processing apparatus of claim 1, wherein the valve includes a housing with the substrate transfer plane being disposed therethrough.

4. The substrate processing apparatus of claim 3, wherein the at least one substrate alignment element comprises a first alignment element disposed on the side of the closure and a second alignment element disposed on the housing to form a cooperative alignment element configured to cooperate in interacting with the substrates travelling along the substrate transfer plane and effect registration of the alignment determinative characteristic of the substrates passing through the substrate transport opening on the substrate transfer plane.

5. The substrate processing apparatus of claim 4, wherein the first alignment element is a reflector and the second alignment element comprises at least one of a beam emitter or beam receiver.

6. The substrate processing apparatus of claim 4 wherein the second alignment element is a reflector and the first alignment element comprises at least one of a beam emitter or beam receiver.

7. The substrate processing apparatus of claim 1, wherein the valve includes a closure drive configured to position the closure relative to the substrate transfer plane so that the at least one substrate alignment element is located at a predetermined interaction position for interacting with substrates located on the substrate transfer plane.

8. The substrate processing apparatus of claim 7, wherein the closure drive includes mechanical stops configured to position the closure within a housing of the valve so that the at least one substrate alignment element is located at the predetermined interaction position.

9. The substrate processing apparatus of claim 7, further comprising a controller communicably connected to the closure drive where the closure drive includes at least one encoder configured to effect, along with the controller, positioning the closure within a housing of the valve so that the at least one substrate alignment element is located at the predetermined interaction position.

10. The substrate processing apparatus of claim 1, wherein the at least one substrate alignment element includes one or more of an optical beam sensor element, an optical reflective sensor element, an inductive sensor element, or a capacitive sensor element.

11. The substrate processing apparatus of claim 1, wherein the substrate processing apparatus comprises a linearly arranged substrate processing tool.

12. The substrate processing apparatus of claim 1, wherein the substrate processing apparatus comprises a cluster substrate processing tool.

13. A method for aligning a substrate in a substrate processing apparatus, the method comprising:

providing a substrate station having an aperture closure for blocking a loading and unloading aperture of the station;

at least unloading substrates from a substrate cassette, the unloaded substrates exiting the substrate cassette through the loading and unloading aperture along a substrate transfer plane so that the substrate cassette is unloaded;

providing an apparatus including a door drive for removing a door of the substrate cassette to open the substrate cassette and for operating the aperture closure to open the loading and unloading aperture;

passing substrates through the loading and unloading aperture on the substrate transfer plane; and effecting, with at least one substrate alignment element disposed on a side of the aperture closure, registration of an alignment determinative characteristic of the substrates unloaded from the substrate cassette, wherein the at least one substrate alignment element is disposed in a predetermined interaction position and orientation so that the at least one substrate alignment element interacts with substrates, from the predetermined interaction position and orientation, located on and traversing along the substrate transfer plane.

14. The method of claim 13, wherein the at least one substrate alignment element is facing the substrate transfer plane.

15. The method of claim 13, further comprising effecting positioning, with the door drive, the aperture closure so that the at least one substrate alignment element is located, relative to the substrate transfer plane, at the predetermined interaction position for interacting with substrates located on the substrate transfer plane.

16. The method of claim 13, further comprising effecting positioning, with mechanical stops of the door drive, the aperture closure so that the at least one substrate alignment element is located at the predetermined interaction position.

17. The method of claim 13, further comprising effecting, with at least one encoder of the door drive along with a controller communicably connected to the door drive, positioning the aperture closure so that the at least one substrate alignment element is located at a predetermined interaction position.

18. The method of claim 13, wherein the at least one substrate alignment element includes one or more of an optical beam sensor element, an optical reflective sensor element, an inductive sensor element, or a capacitive sensor element.

19. The method of claim 13, wherein the aperture closure includes a housing with the substrate transfer plane being disposed therethrough.

20. The method of claim 19, wherein a first alignment element of the at least one substrate alignment element is disposed on the side of the aperture closure and a second alignment element of the at least one substrate alignment element is disposed on the housing to form a cooperative alignment element that interacts with the substrates travelling along the substrate transfer plane and effects registration of the alignment determinative characteristic of the substrates passing through the substrate transport opening on the substrate transfer plane.

* * * * *